(12) United States Patent
Chu et al.

(10) Patent No.: US 9,850,125 B2
(45) Date of Patent: Dec. 26, 2017

(54) MEMS INTEGRATED PRESSURE SENSOR DEVICES HAVING ISOTROPIC CAVITITES AND METHODS OF FORMING SAME

(71) Applicant: Taiwan Semiconductor Manufacturing Company, Ltd., Hsin-Chu (TW)

(72) Inventors: Chia-Hua Chu, Zhubei (TW); Chun-Wen Cheng, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 15/041,886

(22) Filed: Feb. 11, 2016

(65) Prior Publication Data

US 2016/0159643 A1    Jun. 9, 2016

Related U.S. Application Data

(63) Continuation of application No. 14/331,495, filed on Jul. 15, 2014, now Pat. No. 9,260,295, which is a
(Continued)

(51) Int. Cl.
*B81B 7/02* (2006.01)
*B81C 1/00* (2006.01)
(Continued)

(52) U.S. Cl.
CPC ............ *B81B 7/02* (2013.01); *B81C 1/00182* (2013.01); *B81C 1/00238* (2013.01);
(Continued)

(58) Field of Classification Search
None
See application file for complete search history.

(56) References Cited

U.S. PATENT DOCUMENTS 8,216,882 B2    7/2012  Lin et al.
8,350,346 B1    1/2013  Huang et al.
(Continued)

FOREIGN PATENT DOCUMENTS

TW    201242382 A    10/2012
WO    2012122872 A1   9/2012

OTHER PUBLICATIONS

Revised Interim Written Description Guidelines Training Materials, downloaded on May 15, 2016.*

*Primary Examiner* — Joseph Schoenholtz
(74) *Attorney, Agent, or Firm* — Slater Matsil, LLP

(57) ABSTRACT

A method embodiment includes providing a MEMS wafer comprising an oxide layer, a MEMS substrate, a polysilicon layer. A carrier wafer comprising a first cavity formed using isotropic etching is bonded to the MEMS, wherein the first cavity is aligned with an exposed first portion of the polysilicon layer. The MEMS substrate is patterned, and portions of the sacrificial oxide layer are removed to form a first and second MEMS structure. A cap wafer including a second cavity is bonded to the MEMS wafer, wherein the bonding creates a first sealed cavity including the second cavity aligned to the first MEMS structure, and wherein the second MEMS structure is disposed between a second portion of the polysilicon layer and the cap wafer. Portions of the carrier wafer are removed so that first cavity acts as a channel to ambient pressure for the first MEMS structure.

20 Claims, 19 Drawing Sheets

Related U.S. Application Data continuation of application No. 13/906,105, filed on May 30, 2013, now Pat. No. 8,802,473.

(60) Provisional application No. 61/784,019, filed on Mar. 14, 2013.

(51) Int. Cl.
  *H01L 23/00* (2006.01)
  *H01L 23/10* (2006.01)
  *H01L 25/00* (2006.01)

(52) U.S. Cl.
  CPC ........ *H01L 24/29* (2013.01); *B81B 2201/025* (2013.01); *B81B 2201/0235* (2013.01); *B81B 2201/0242* (2013.01); *B81B 2201/0264* (2013.01); *B81B 2203/0127* (2013.01); *B81B 2203/0315* (2013.01); *B81C 2201/013* (2013.01); *B81C 2201/019* (2013.01); *B81C 2203/0118* (2013.01); *B81C 2203/0792* (2013.01); *H01L 23/10* (2013.01); *H01L 24/32* (2013.01); *H01L 24/83* (2013.01); *H01L 25/50* (2013.01); *H01L 2224/291* (2013.01); *H01L 2224/29011* (2013.01); *H01L 2224/29013* (2013.01); *H01L 2224/29124* (2013.01); *H01L 2224/29144* (2013.01); *H01L 2224/32145* (2013.01); *H01L 2224/83193* (2013.01); *H01L 2224/83805* (2013.01); *H01L 2924/01322* (2013.01); *H01L 2924/1461* (2013.01)

(56) References Cited

U.S. PATENT DOCUMENTS

| | | | |
|---|---|---|---|
| 8,513,747 B1 | 8/2013 | Huang et al. | |
| 8,524,519 B2 | 9/2013 | Wang et al. | |
| 8,802,473 B1 * | 8/2014 | Chu | B81B 7/02 257/415 |
| 8,890,191 B2 | 11/2014 | Shiu et al. | |
| 9,260,295 B2 * | 2/2016 | Chu | B81B 7/02 |
| 2005/0176179 A1 | 8/2005 | Ikushima et al. | |
| 2006/0016486 A1 | 1/2006 | Teach et al. | |
| 2007/0231943 A1 | 10/2007 | Ouellet et al. | |
| 2008/0192963 A1 | 8/2008 | Sato | |
| 2011/0121412 A1 | 5/2011 | Quevy et al. | |
| 2012/0038372 A1 * | 2/2012 | Reinmuth | B81C 1/00142 324/661 |
| 2012/0098074 A1 | 4/2012 | Lin et al. | |
| 2012/0261744 A1 | 10/2012 | Wang et al. | |
| 2012/0261774 A1 | 10/2012 | Graham et al. | |
| 2012/0280594 A1 | 11/2012 | Chen et al. | |
| 2012/0326248 A1 | 12/2012 | Daneman et al. | |
| 2013/0108074 A1 | 5/2013 | Reining | |
| 2013/0214370 A1 * | 8/2013 | Hussain | G01L 9/0055 257/420 |
| 2013/0334620 A1 | 12/2013 | Chu et al. | |
| 2014/0042562 A1 | 2/2014 | Chu et al. | |
| 2014/0239353 A1 * | 8/2014 | Daneman | B81C 1/00158 257/254 |
| 2014/0264648 A1 | 9/2014 | Chu et al. | |
| 2014/0264653 A1 | 9/2014 | Cheng et al. | |
| 2014/0264661 A1 | 9/2014 | Cheng et al. | |
| 2014/0264662 A1 | 9/2014 | Cheng et al. | |
| 2014/0319631 A1 | 10/2014 | Chu et al. | |
| 2015/0246807 A1 | 9/2015 | Chu et al. | |
| 2015/0307346 A1 | 10/2015 | Cheng et al. | |

\* cited by examiner

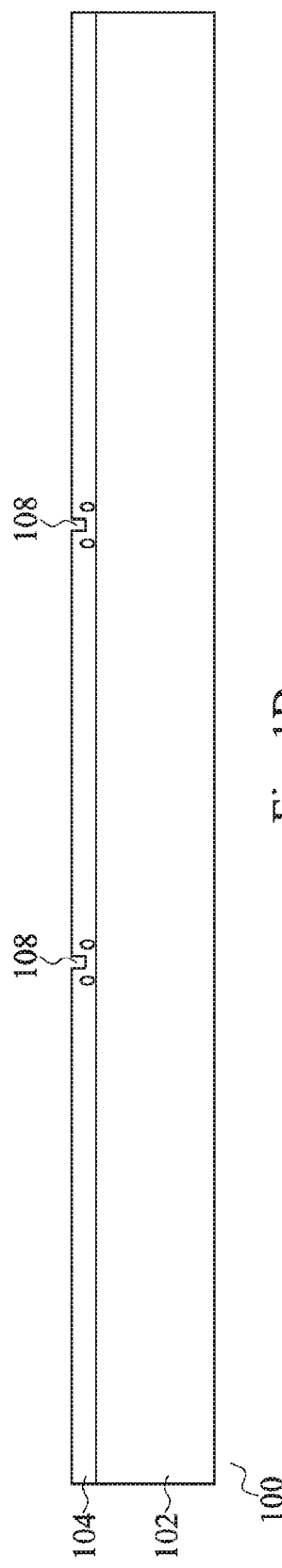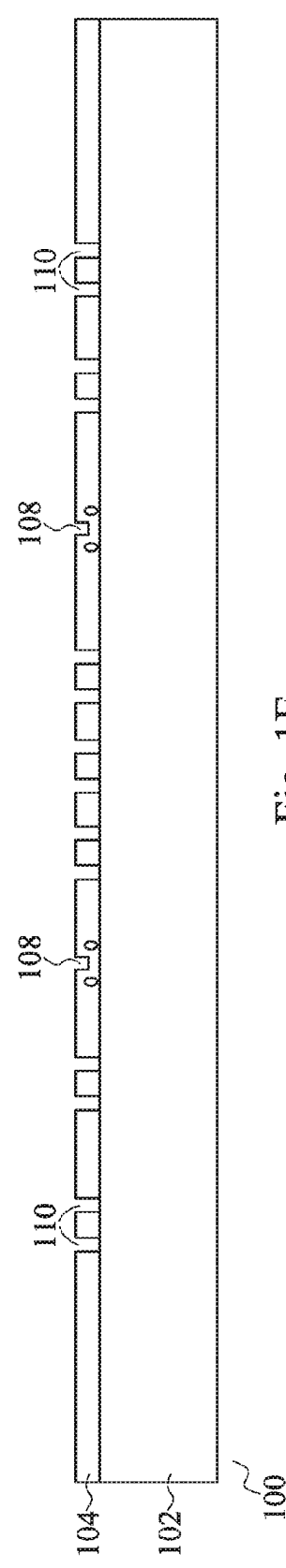

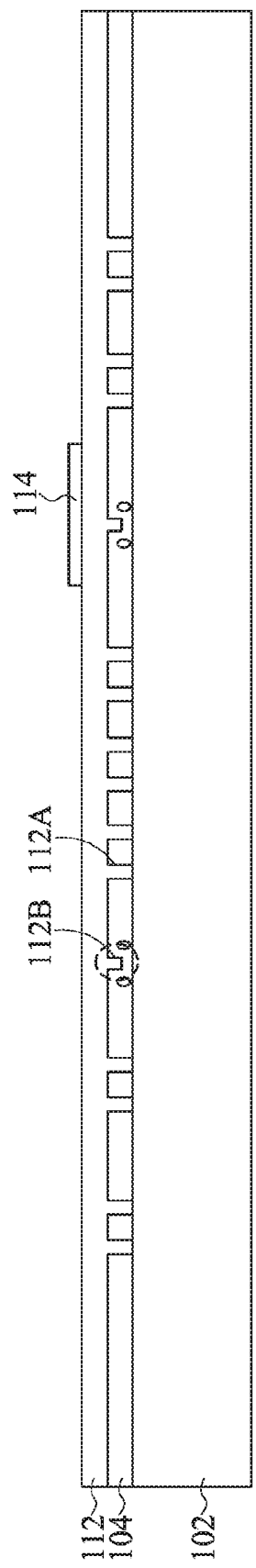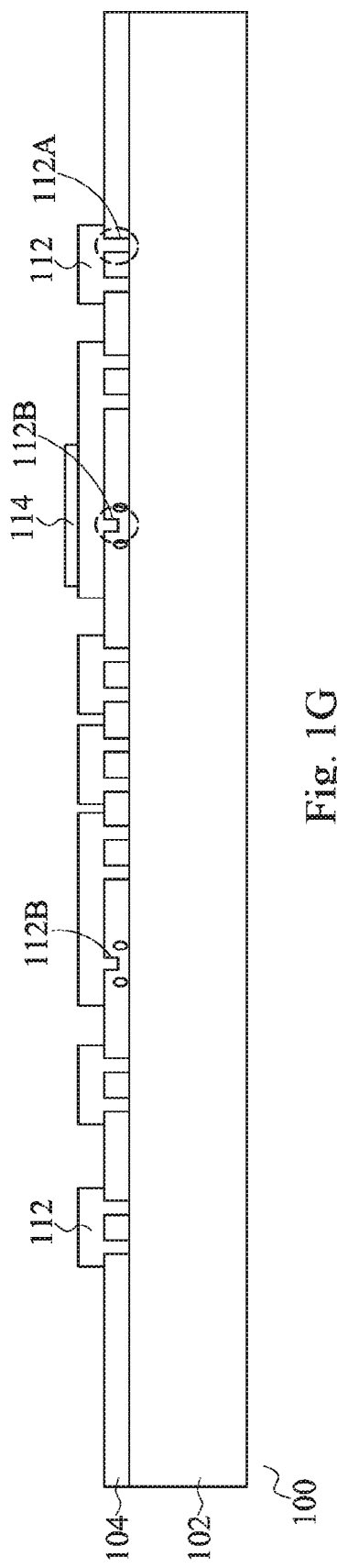

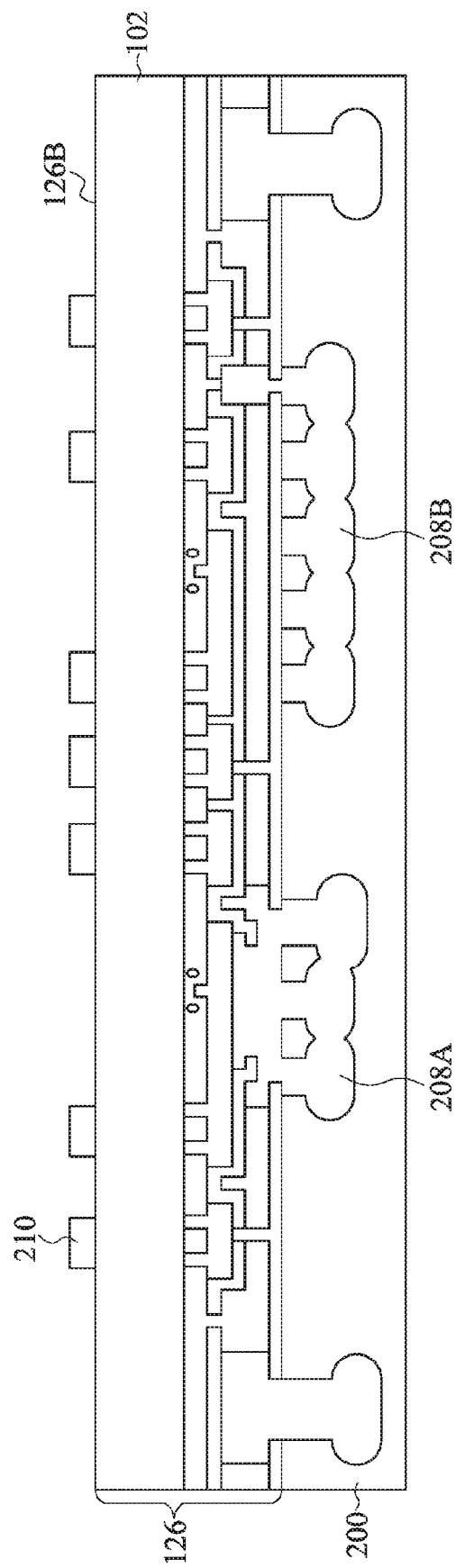

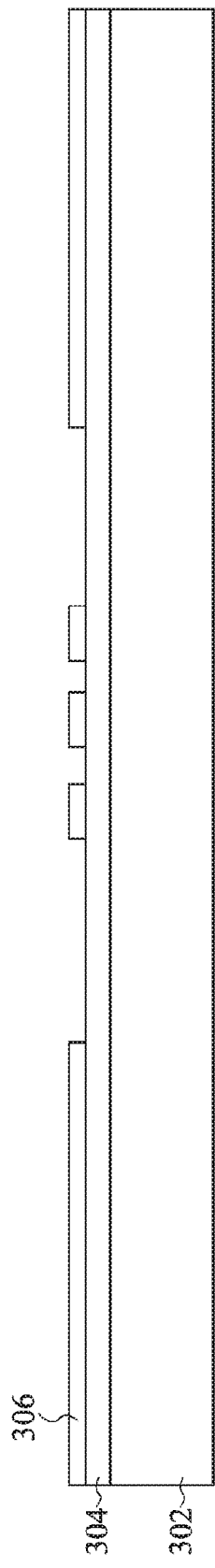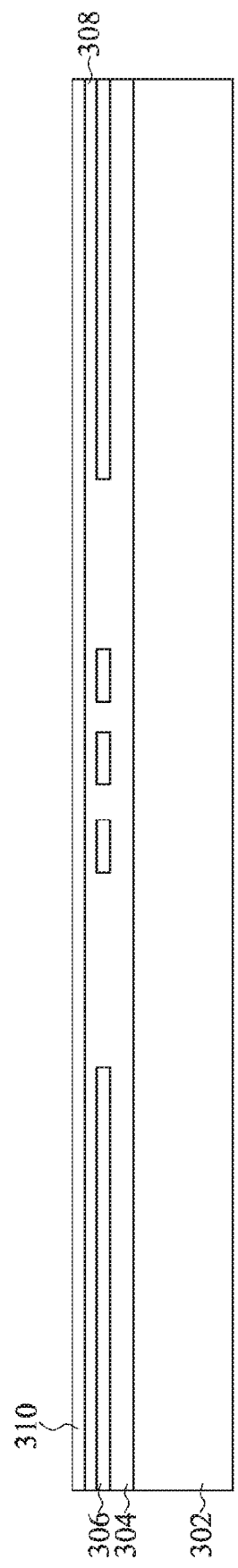

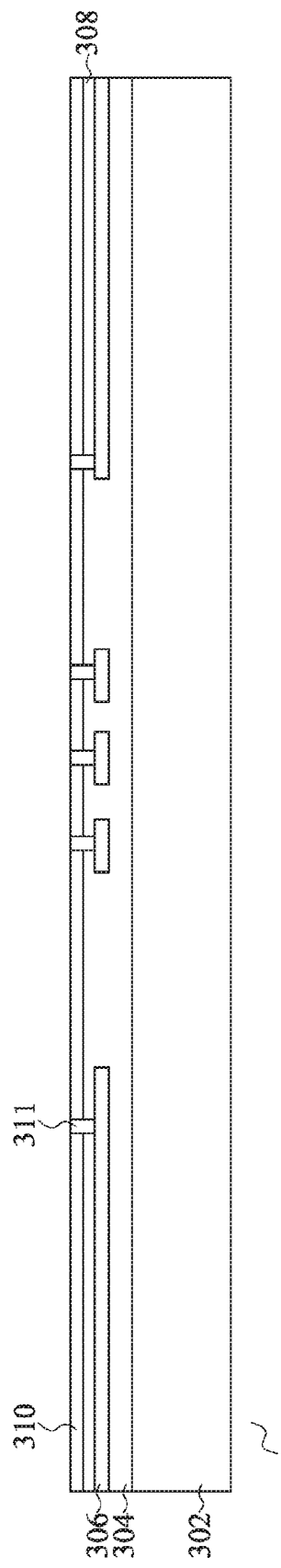
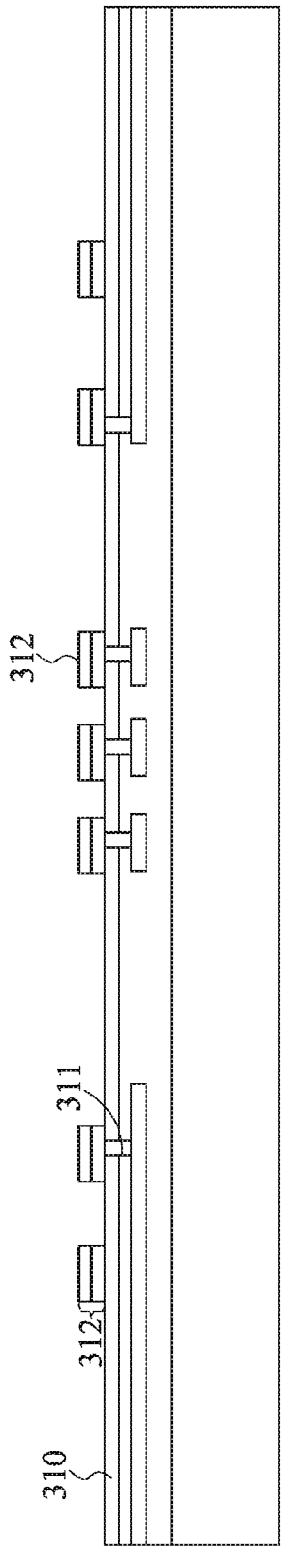

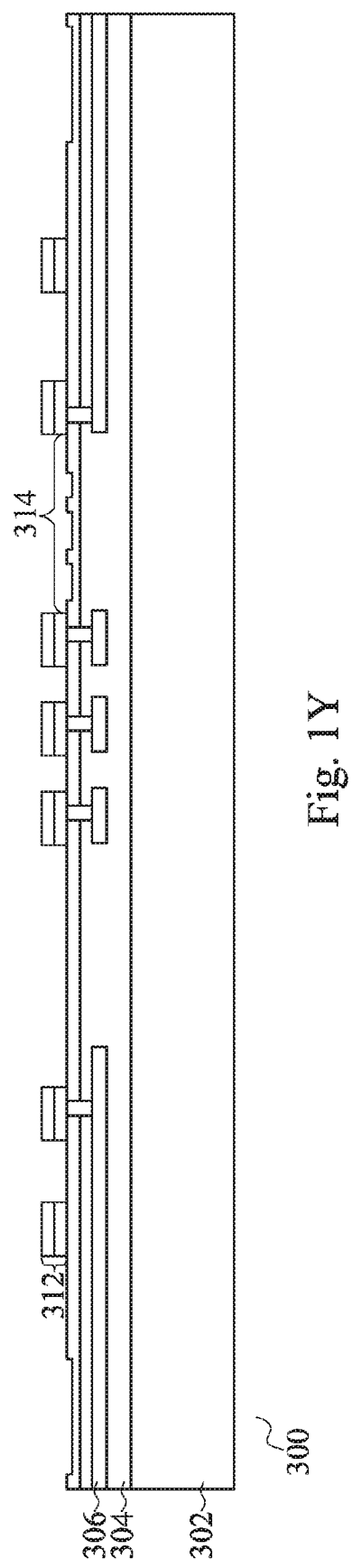

MEMS INTEGRATED PRESSURE SENSOR DEVICES HAVING ISOTROPIC CAVITITES AND METHODS OF FORMING SAME

CROSS-REFERENCE TO RELATED APPLICATIONS

This application is a continuation of U.S. Ser. No. 14/331,495, filed Jul. 15, 2014, which is a continuation of U.S. Ser. No. 13/906,105, filed May 30, 2013, which claims the benefit of U.S. Provisional Application No. 61/784,019, filed on Mar. 14, 2013, entitled "MEMS Pressure and Motion Sensor Devices Having Isotropic Cavities and Methods of Forming Same," which applications are hereby incorporated herein by reference.

This application relates to the following co-pending and commonly assigned patent applications: "MEMS Integrated Pressure Sensor Devices and Methods of Forming Same" (U.S. Ser. No. 13/894,821); "MEMS Integrated Pressure Sensor and Microphone Devices and Methods of Forming Same" (U.S. Ser. No. 13/944,382); "MEMS Integrated Pressure Sensor and Microphone Devices having Through-Vias and Methods of Forming Same" (U.S. Ser. No. 13/955,957); and "MEMS Device and Methods of Forming Same" (U.S. Ser. No. 13/893,058).

BACKGROUND

Micro-electromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating MEMS pressure sensor devices with other MEMS devices (e.g., motion sensor devices) into the same integrated circuit manufacturing process has posed challenges.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1A:
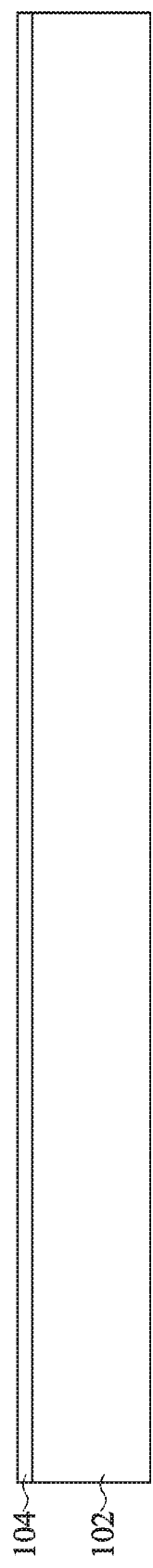
FIGS. 1A-1AC are cross-sectional views of intermediate stages of manufacture of a MEMS device in accordance with various embodiments.

FIGS. 1A-1AC illustrate cross-sectional views of intermediate stages of manufacture of a portion of a MEMS device 100 having a pressure sensor 404 and another device 406 (see FIG. 1AC). Device 406 may be a MEMS motion sensor, a gyroscope, an accelerometer, or the like. Pressure sensor 404 and device 406 are manufactured using the same integrated circuit (IC) process to create sealed cavities (i.e., cavities 408 and 410) and an ambient environment opening (i.e., cavity 208A) in MEMS device 100. Therefore, various embodiments illustrated by FIGS. 1A-1AC allow for the smooth integration of manufacturing a MEMS pressure sensor device using known IC manufacturing techniques.

As shown in FIG. 1A, MEMS device 100 includes a substrate 102 and a dielectric layer 104, referred to as oxide release layer 104. Substrate 102 (sometimes referred to as MEMS substrate 102) may be formed of silicon, or other materials such as silicon germanium, silicon carbide, or the like. Substrate 102 may be formed of low resistive silicon. Alternatively, substrate 102 may be a silicon-on-insulator (SOI) substrate. SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

Oxide release layer 104 may be formed of a low-k dielectric material, such as silicon dioxide ($SiO_2$). Oxide release layer 104 may be deposited over substrate 102 using, for example, spinning, chemical vapor disposition (CVD), plasma enhanced chemical vapor deposition (PECVD), low pressure CVD, thermal oxidation, or other suitable deposition techniques as are known in the art. Furthermore, oxide release layer 104 may be formed of a different suitable material such as low-k dielectrics such as carbon doped oxides, extremely low-k dielectrics such as porous carbon doped silicon dioxide, a polymer such as polyimide, combinations thereof, or the like. Oxide release layer 104 may be released (i.e., removed) in subsequent process steps in order to form MEMS structures; therefore, oxide release layer 104 may also be referred to as sacrificial (SAC) oxide layer or sacrificial layer 104.

Figure 1B:
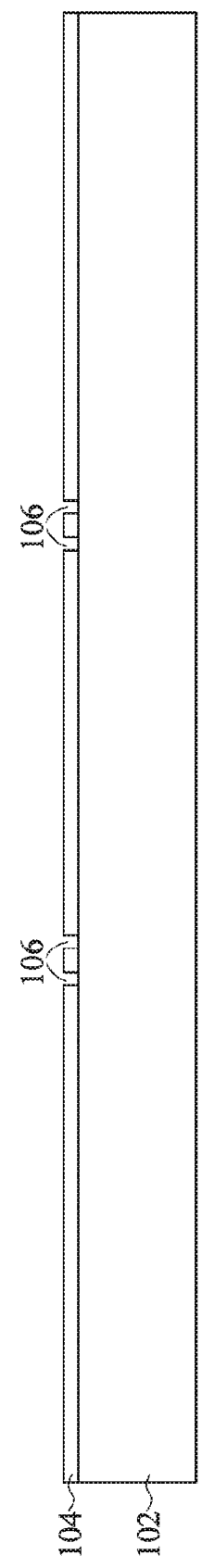
Figure 1C:
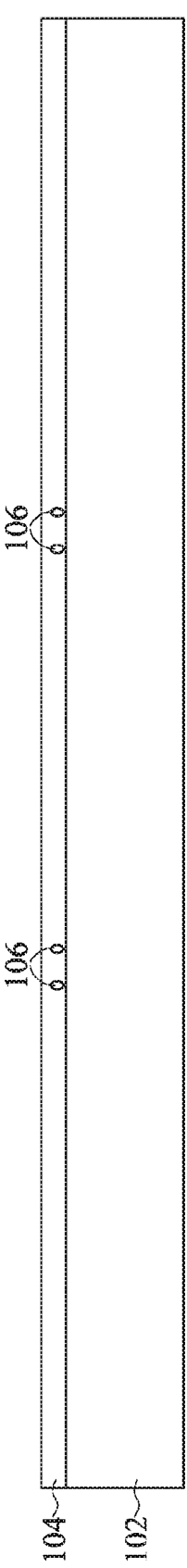

FIG. 1B illustrates the patterning of oxide release layer 104 to include openings 106. This may be done, for example, using a combination of photolithography and etching techniques. In FIG. 1C, upper portions of openings 106 are seamed together, sealing openings 106, which may now be referred to as voids. Openings 106 may be seamed together using, for example, an oxide deposition process applied to the upper surface of oxide release layer 104. For example, the deposition of additional oxide material over oxide release layer 104 may be employed to seal off the upper portions of openings 106. The oxide deposition may be formed using a deposition process such as CVD or the like. More particularly, by controlling the deposition process, the material of oxide release layer 104 may be deposited in a non-conformable manner. That is, the material of oxide release layer 104 may build up on the upper portions of openings 106 faster than along the sidewalls and bottom of openings 106. This process leads to the formation of an overhang at the edge of the upper portion of opening 106, and as the deposition process continues, the overhangs will merge, sealing off opening 106 with a plurality of seams and forming voids.

Voids 106 may be included in oxide release layer 104 to decrease release time in subsequent process steps. That is, the inclusion of voids 106 creates weak spots in oxide release layer 104 that reduces releasing time of MEMS structures. Alternatively, the steps shown in FIGS. 1B and 1C may be omitted if release time speed is not a concern, or an alternative design for a MEMS device includes different methods of decreasing release time.

In FIGS. 1D and 1E, oxide release layer 104 is patterned, creating bump openings 108 and via openings 110. The patterning of oxide release layer 104 may be done using, for example, a combination of photolithography and etching techniques. Two separate photolithography steps may be performed in order to create bump openings 108 and via openings 110. For example, a shallow etching may be performed to create bump openings 108, while a deep etching may be performed to create via openings 110. As shown in FIGS. 1D and 1E, bump openings 108 do not extend to substrate 102 while via openings 110 do extend to and expose portions of substrate 102. Furthermore, oxide release layer 104 may be thinned (not shown) until a desired thickness is achieved. The thinning process may be implemented by using suitable techniques such as grinding, polishing, and/or chemical etching. For example, a chemical mechanical polishing (CMP) process may be used to thin oxide release layer 104. In accordance with various embodiments, the thickness of oxide release layer 104 is in a range from about 0.5 µm to about 5 µm.

In FIG. 1F, a layer 112 is deposited over oxide release layer 104 using, for example, CVD. Layer 112 may be formed of polysilicon and is referred to as polysilicon layer 112 hereinafter. Layer 112 fills via openings no and bump openings 108, forming vias 112A and bumps 112B respectively. Vias 112A may be formed for electrical routing and may further act as a mechanical structure. For example vias 112A may be used as a vapor hydrogen-fluoride (vapor HF) etch stop layer in subsequent process steps. Furthermore, in some embodiments, bumps 112B may be used as mechanical bumps to limit the motion of moving elements in MEMS device 100, or as anti-stiction bumps. In alternative embodiments, layer 112 may be formed of a different material in lieu of polysilicon such as a dielectric material, SiGe, single crystal silicon (e.g., by using a silicon-on-insulator wafer as a starting material), and the like. It should be noted that while a single-polysilicon layer is illustrated, those skilled in the art will recognize that multiple polysilicon layers could be employed.

An oxide mask layer 114 may be formed and patterned over a portion of polysilicon layer 112. Oxide mask layer 114 is formed out of a similar material and using similar methods as oxide release layer 104, and oxide mask layer 114 may be patterned using for example, a combination of photolithography and etching. Oxide mask layer 114 acts as protection for critical portions of polysilicon layer 112 in subsequent process steps. For example, in FIG. 1F, oxide mask layer protects a portion of polysilicon layer 112 to ensure proper thickness control and surface texture. Oxide mask layer 114 may be formed over any portion of polysilicon layer 112 where such control is desired. If surface texture and thickness is not crucial, oxide mask layer 114 may be omitted.

In FIG. 1G, polysilicon layer 112 is patterned using for example a combination of photolithography and etching. The patterning of polysilicon layer 112 may be done in order to create portions of various devices in MEMS device 400. For example, the patterning of polysilicon layer 112 in FIG. 1G creates separate portions of polysilicon layer 112 for inclusion in as a bottom electrode of a motion sensor (or other applicable device) and a membrane of a pressure sensor respectively.

Figure 1H:
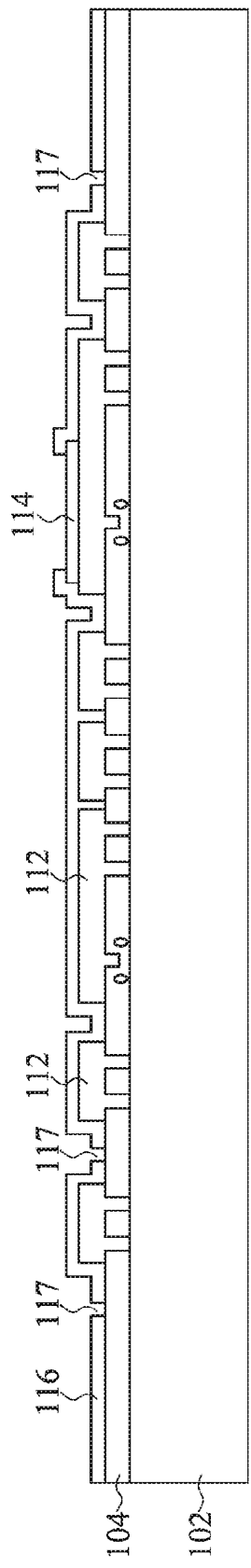

In FIG. 1H, etch stop layer 116 is formed and patterned over oxide release layer 104 and polysilicon layer 112. Etch stop layer 116 may be deposited using, for example, low pressure chemical vapor deposition (LPCVD), and etch stop layer 116 may be patterned using, for example, a combination of photolithography and etching. Etch stop layer 116 is pattered to include release holes 117 and to expose portions of oxide mask layer 114. Release holes 117 provide a path to remove portions of oxide release layer 104 in subsequent process steps. Etch stop layer 116 may be used as a vapor HF etch stop layer and may be formed of a low-stress nitride (LSN). However, other materials such as aluminum nitride, aluminum oxide, silicon carbide, or other dielectrics chemically resistant to vapor HF may be used as well.

Figure 1I:
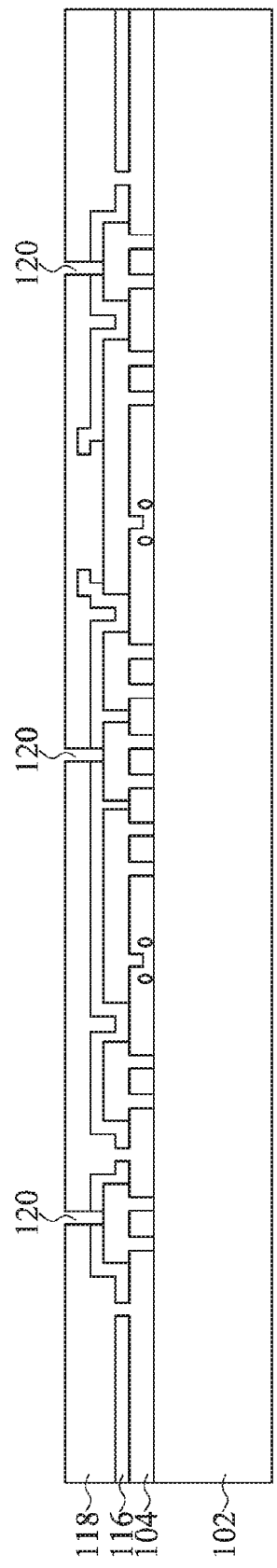

FIG. 1I illustrates the formation and patterning of an oxide release layer 118. Oxide release layer 118 formed of substantially the same material and using substantially the same methods as oxide release layer 104. The thickness of oxide release layer 118 and first oxide release 104 may be designed to control parasitic feedback through capacitance and/or the gap between the subsequent movable element of MEMS structure 100 and a polysilicon layer 122 (see FIGS. 1J and 1AC). Oxide release layer 118 may be blanket deposited and then undergo a thinning process (e.g., CMP or etch-back) to reach a desired flatness and/or thickness. Oxide release layer 118 is patterned to create via openings 120 using for example, a combination of photolithography and etching.

Figure 1J:
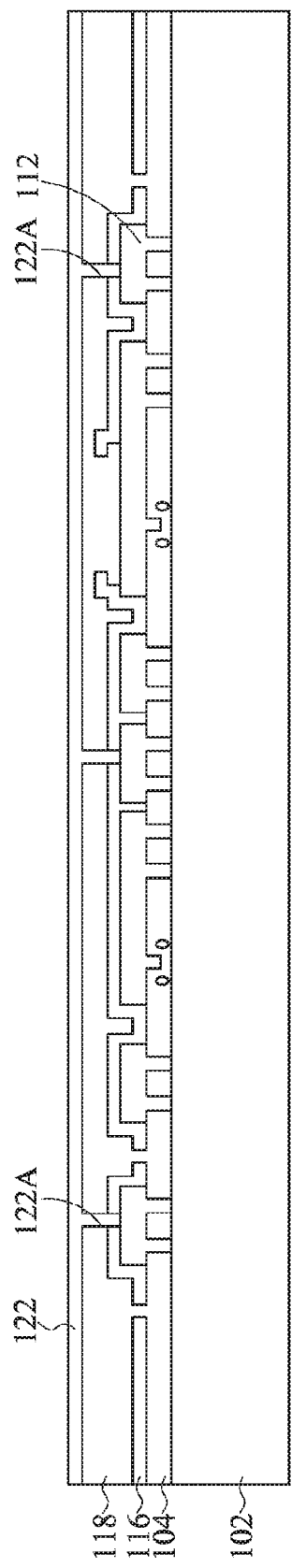

FIG. 1J illustrates the formation of a thin polysilicon layer 122 over oxide release layer 118. Thin polysilicon layer 122 may be formed on oxide release layer 118 using suitable techniques such as CVD, and the like. Thin polysilicon layer 122 is deposited into via openings 120, creating via portions 122A connected to polysilicon layer 112. Thin polysilicon layer 122 may act as electrical routing (e.g., using via portions 122A). Thin polysilicon layer 122 also as a shield for various components of MEMS device 100 (e.g., substrate 102 and polysilicon layer 112) in subsequent process steps. Thin polysilicon layer 122 also acts as a bonding interface layer; therefore, other suitable bonding materials such as silicon, amorphous silicon, silicon doped with impurities, combinations thereof, and the like may be used in lieu of polysilicon.

Figure 1K:
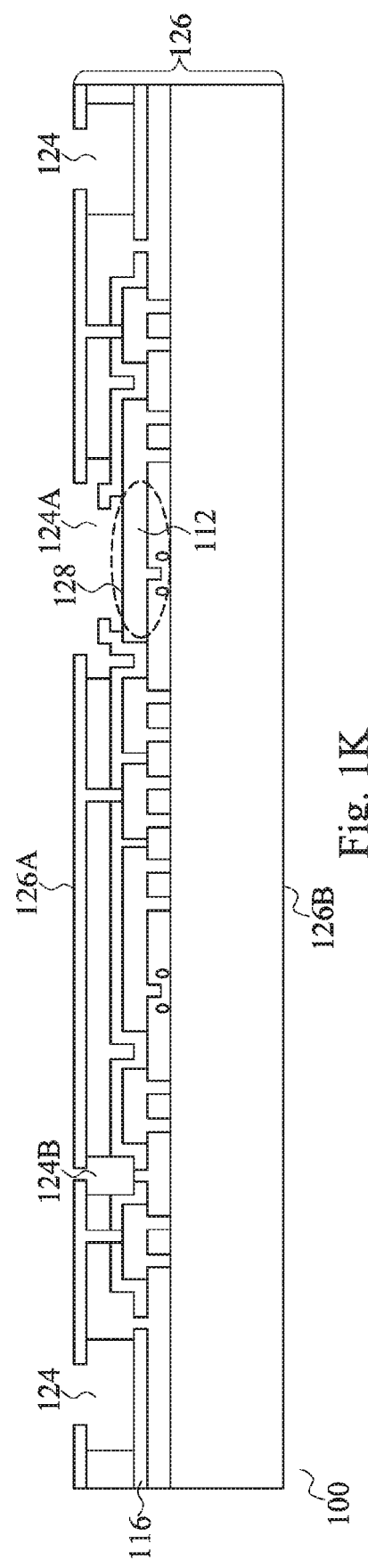

In FIG. 1K, portions of thin polysilicon layer 122 and oxide release layer 118 are etched, creating openings 124. This may be done using, for example, a combination of wet and dry etching techniques. Notably, one of the openings 124 (124A) exposes region 128 of polysilicon layer 112, and another opening (124B) exposes a portion of etch stop layer 116 and a different portion of polysilicon layer 112. Region 128 of polysilicon layer 112 may act as a membrane of a pressure sensor device in completed MEMS device 100 (e.g., see element 404 in FIG. 1AC). In a completed MEMS device 100, opening 124A exposes this portion of polysilicon layer 112 to a type of pressure (e.g., ambient pressure or sealed pressure depending on the design of MEMS device 100). The etching of thin polysilicon layer 122 and oxide release layer 118 completes a MEMS wafer 126 of MEMS device 100. MEMS wafer 126 has a top and bottom surface, 126A and 126B respectively.

Figure 1L:

FIGS. 1L-1P illustrate intermediate steps of manufacture of a carrier wafer 200 in accordance with various embodiments. In FIG. 1L, a carrier wafer 200 is provided. Carrier wafer 200 includes a substrate 202 under a dielectric layer 204. Substrate 202 (sometimes referred to as carrier substrate 202) may be a silicon substrate, and dielectric layer 204 may be a thermal oxide layer formed by performing a thermal oxidation on the carrier wafer 200.

Figure 1M:
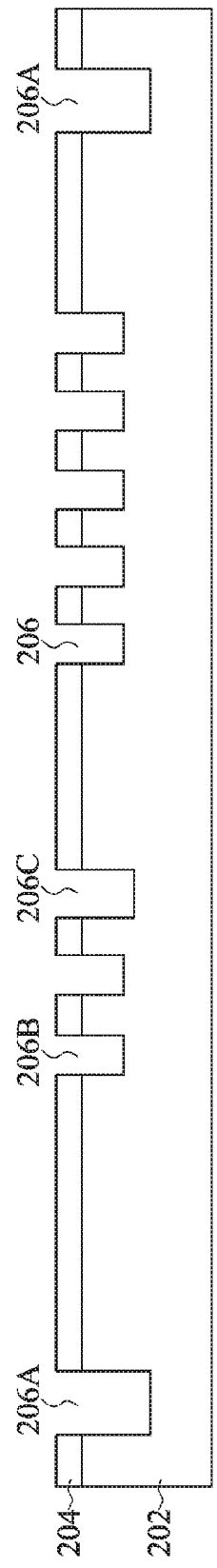

FIG. 1M illustrates the etching of carrier wafer 200 forming openings 206. A deep reactive-ion etching (DRIE) process may be performed to form openings 206 in substrate 202. It should be noted that due to etching loading effects, wider openings 206A are deeper than the narrower openings 206C in substrate 202. Similarly, openings 206C are wider and therefore deeper than narrowest openings 206B. Thus, by controlling the width of various openings 206, varying depths may be created. Openings 206A are deeper than openings 206C, and openings 206C are deeper still than openings 206B. That is, openings 206A are the deepest openings, and openings 206B are the shallowest openings in carrier wafer 200.

Figure 1N:
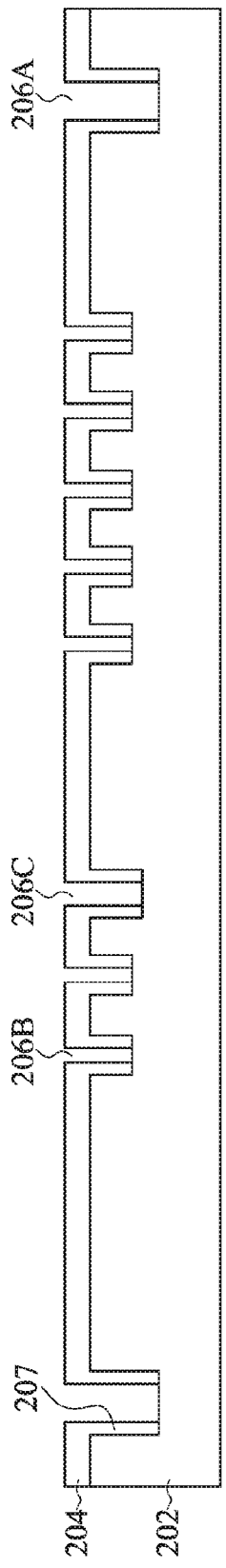

FIG. 1N illustrates an oxide layer 207 being deposited in openings 206 by any suitable oxidation processes such as wet or dry thermal oxidation process, CVD, or the like. An etching process, such as a reactive ion etch or other dry etch, an anisotropic wet etch, or any other suitable anisotropic etch or patterning process, is performed to remove the bottom portion of oxide layer 207. As a result, the bottom portions of openings 206 are free from oxide while sidewalls of openings 206 are protected by oxide layer 207. It should be noted that the protection layer formed on the sidewalls can be replaced by other materials such as photoresist, polymer, and the like.

Figure 1O:
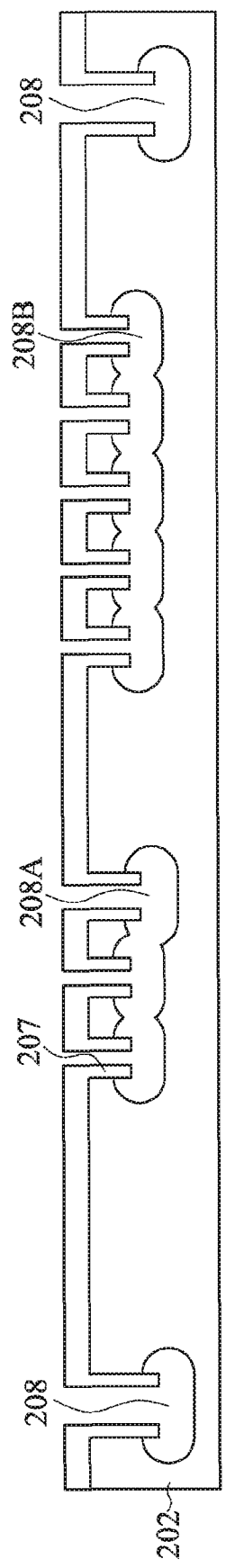

FIG. 1O illustrates carrier wafer 200 after an etching process has been applied. Portions of substrate 202 may be removed to form cavities 208 by an etching process. The etching process may be any suitable etching processes such as isotropic silicon etching processes. After the etching process, carrier wafer 200 includes cavities 208A and 208B. Notably, 208A includes a portion corresponding to an opening 206C (see FIG. 1M) that extends deeper into substrate 202 than other portions of cavities 208A and 208B. The protection layers (i.e., oxide layer 207) prevent the etching process from damaging portions of the remaining substrate 202.

Figure 1P:
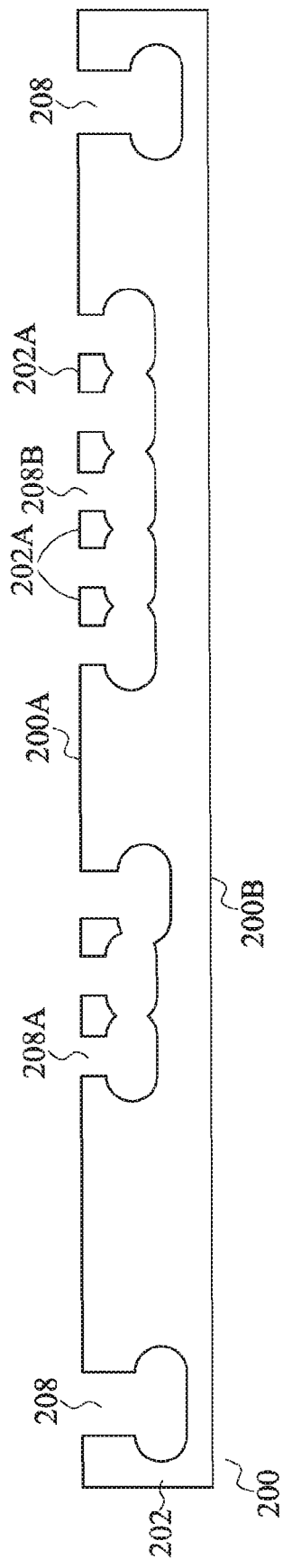

In FIG. 1P, an oxide removal process is applied to the carrier wafer. Various oxide layers (such as protection layer 207) have been removed through a suitable removal process such as a wet etch process. The removal process is applied to the top surface (surface 200A) of the carrier wafer until substrate 202 is exposed. It should be noted the oxide removal is an optional step. A subsequent bonding process (e.g., a fusion bonding process) is capable of bonding a carrier wafer with an oxide bonding interface with a MEMS wafer. By isotropically etching substrate 202, large continuous, cavities (e.g., cavities 208A and 208B) may be formed while still retaining upper portions of substrate 202 (e.g., 202A) over the cavities, and these upper portions of substrate 202 may improve adhesion and aid in subsequent bonding processes.

Figure 1Q:
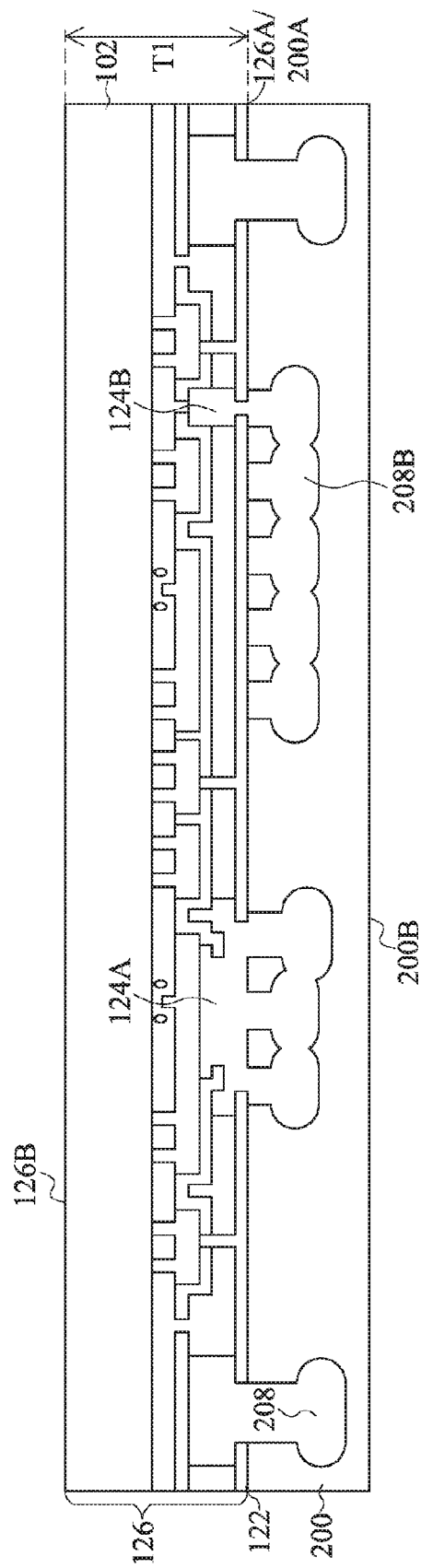

In FIG. 1Q, MEMS wafer 126 is bonded to carrier wafer 200. Specifically, the top surface 126A of MEMS wafer 126 is bonded to top surface 200A of carrier wafer 200. Openings 124A and 124B of MEMS wafer 126 may be aligned to cavities 208A and 208B of carrier wafer 200, respectively. MEMS wafer 126 may be bonded to carrier wafer 200 using any suitable technique such as fusion bonding, anodic bonding, eutectic bonding, and the like. In various embodiments, MEMS wafer 126 may be fusion bonded to carrier wafer 200 using thin polysilicon layer 122 as a bonding interface.

Furthermore, MEMS wafer 126 may be thinned to a desired thickness T1. The thinning process may include grinding and chemical mechanical polishing (CMP) processes, etch back processes, or other acceptable processes performed on surface 126B of MEMS wafer 126 (i.e., substrate 102). As a result of this thinning process, MEMS wafer 126 may have a thickness between about 5 µm to about 60 µm.

In FIG. 1R, conductive bonds 210 are formed and patterned over substrate 102 (i.e., bottom surface 126B of MEMS wafer 126). Conductive bonds 210 may be formed of aluminum copper (AlCu) and are used for eutectic bonding in subsequent process steps. Alternatively, a different conductive material suitable for eutectic bonding such as Ge, Au, combinations thereof, or the like may be used instead.

Figure 1S:
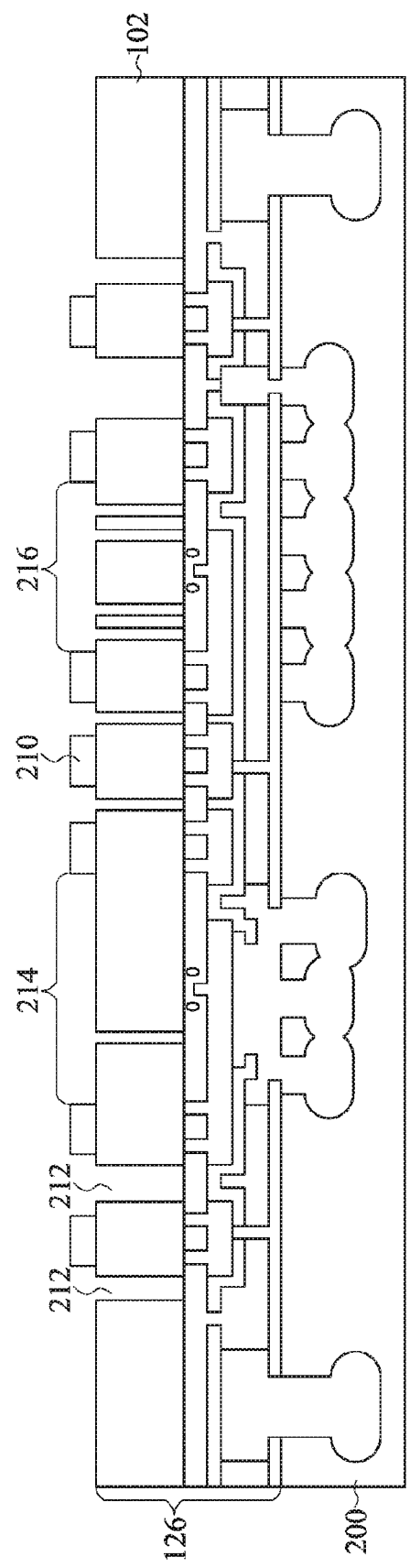

In FIG. 1S, portions of substrate 102 are patterned forming openings 212 using for example, a combinations of photolithography and etching. The portions of the remaining substrate 102 may form various MEMS structures (e.g., MEMS structures 214 and 216). MEMS structure 214 may act as a bottom electrode of a pressure sensor device in finished MEMS device 100. MEMS structure 216 may be patterned to act as a proof mass of a motion sensor device in finished MEMS device 100. Alternatively, MEMS structure 216 may also be patterned to be portions of other MEMS devices such as a spring (e.g., for a gyroscope), a series of fingers in a comb (e.g., for an accelerometer), or the like.

Figure 1T:
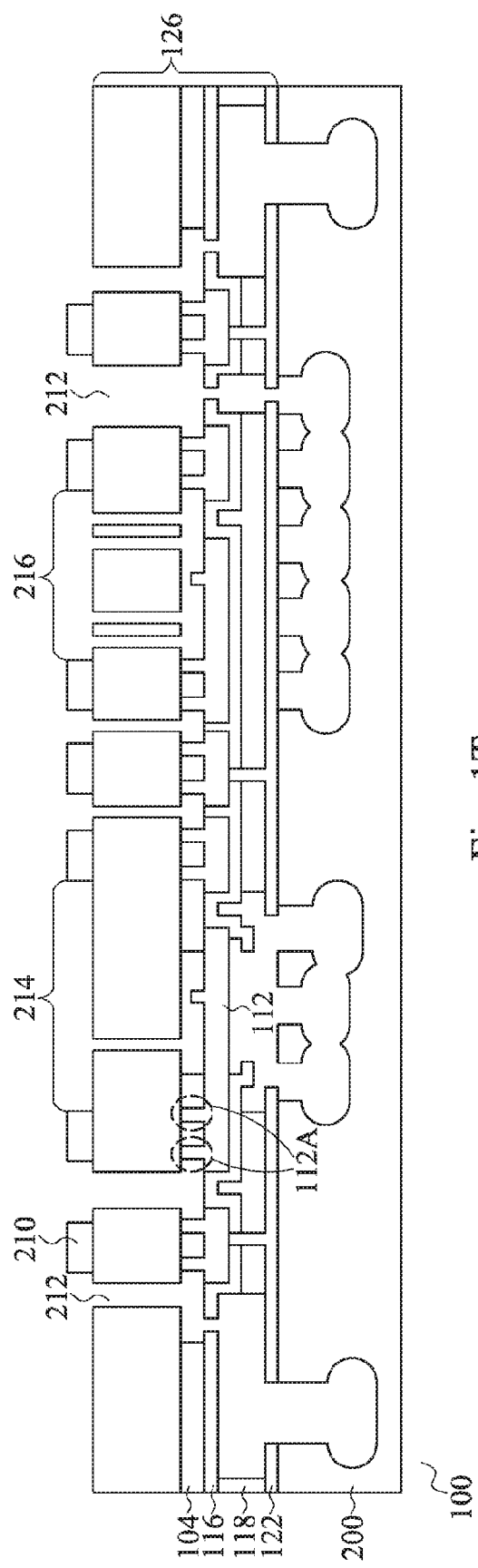

FIG. 1T illustrates a vapor HF etching of portions of oxide release layers 104 and 118, releasing MEMS structures 214 and 216. This type of etching process has a high selectivity between oxide release layers 104 and 118, etch stop layer 116, polysilicon layer 112, thin polysilicon layer 122, and carrier wafer 200 so that that polysilicon layers 112 and 122, carrier wafer 200, and etch stop layer 116 are not significantly attacked during the removal of portions of oxide release layers 104 and 118. Furthermore, polysilicon layer 112 (e.g., vias 112A) and etch stop layer 116 protects portions of first and oxide release layers 104 and 118 during the etch process, and these protected regions may be referred to as anchor regions. This etch process allows for free movement of the movable elements of MEMS structures 216 in at least one axis. Furthermore, MEMS structure 214 may be designed to be stiff and having a relatively limited range of motion even after the vapor HF process. It should be noted that the oxide release layers to be removed depend on layout design.

FIGS. 1U-1Y illustrate various intermediary steps of manufacture of a cap wafer 300 for inclusion in the completed MEMS device 100. Cap wafer 300 may or may not be a CMOS wafer, which may or may not have electrical circuits (not shown). In particular cap wafer 300 may include various active devices such as transistors, capacitors, resistors, diodes, photodiodes, fuses and the like. The electrical circuits may be interconnected to perform one or more functions suitable for a particular application, which may or may not be related to MEMS device 100. FIG. 1U illustrates cap wafer 300 as having substrate 302, oxide layer 304, and patterned metal lines 306. Substrate 302 (sometimes referred to as cap substrate 302) and oxide layer 304 may be substantially similar to substrate 102 and oxide layer 104 in MEMS wafer 126. Metal lines 306 may be formed of aluminum copper (AlCu) and may be used for electrical routing. Alternatively, metal lines 306 may be formed of another suitable metallic material.

In FIG. 1V, a conforming oxide layer 308 is formed over metal lines 306. Conforming oxide layer 308 may be deposited using any suitable technique, such as CVD, and the like and may be a low-k dielectric material. The formation of conforming oxide layer 308 may include a grinding process (e.g., CMP) to achieve a desired topography and thickness. A film layer 310 is deposited over conforming oxide layer 308 using a suitable technique such as CVD. In some embodiments, film layer 310 is formed of silicon nitride and is used as a passivation layer. Alternatively, film layer 310 may be formed of a dielectric material such as an oxide, a metal, combinations thereof, or the like. In subsequent process steps, portions of film layer 310 may be patterned to create mechanical bumps in cap wafer 300.

FIG. 1W illustrates insertion of contact plugs 311 into cap wafer 300. Contact plugs 311 may be formed of tungsten, although other metallic materials such as aluminum or copper may also be used. Contact plugs 311 may be formed for example, by patterning film layer 310 and conforming oxide layer 308, exposing metal lines 306. A conductive material, e.g., tungsten, may be deposited in the patterned openings and a CMP technique may be used so that the top surface of contact plugs 311 may be level with the top surface of film layer 310. Contact plugs 311 are electrically connected to metal lines 306.

In FIG. 1X, bonding material layers 312 (alternatively referred to as bonds 312) are formed over a top surface of film layer 310. Bonding material layer may be blanket deposited and patterned using for example physical vapor deposition (PVD) and photolithography/etching. Bonding material layers 312 may be made of a layer of aluminum copper under a layer of germanium although other metallic materials such as gold may also be used. Bonding material layers 312 may act as a eutectic bonding material for a subsequent bonding process. Bonding material layers 312 may or may not be electrically connected to metal lines 306 via contact plugs 311.

In FIG. 1Y, a shallow etching is performed on portions of film layer 310. Portions of film layer 310 may be shallow etched to facilitate the exposure of metal line 306 in a subsequent process step. Furthermore, the etching of film layer 310 may form bumps 314. Bumps 314 may serve a variety of purposes. For example, in an embodiment bumps 314 are mechanical bumps included to limit the motion of moving elements in MEMS device 100. Bumps 314 may also be used as anti-stiction bumps.

Figure 1Z:
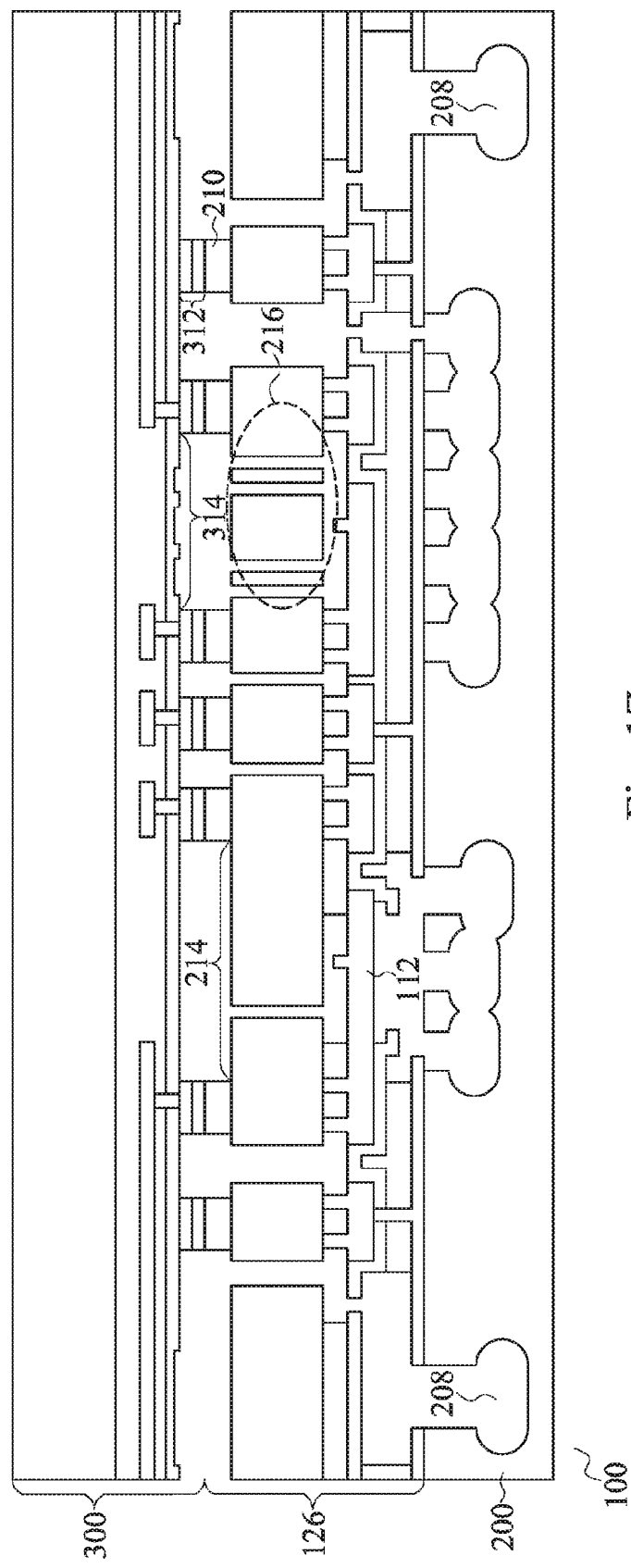
Figure 1A:
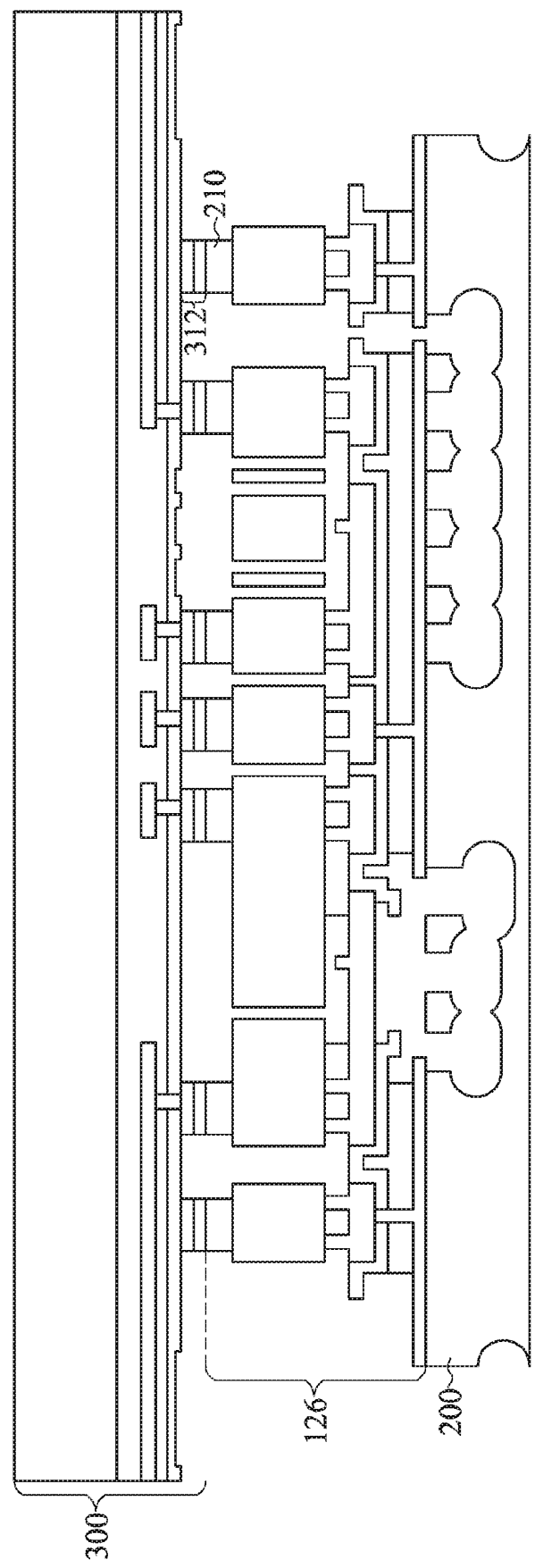
Figure 1A:
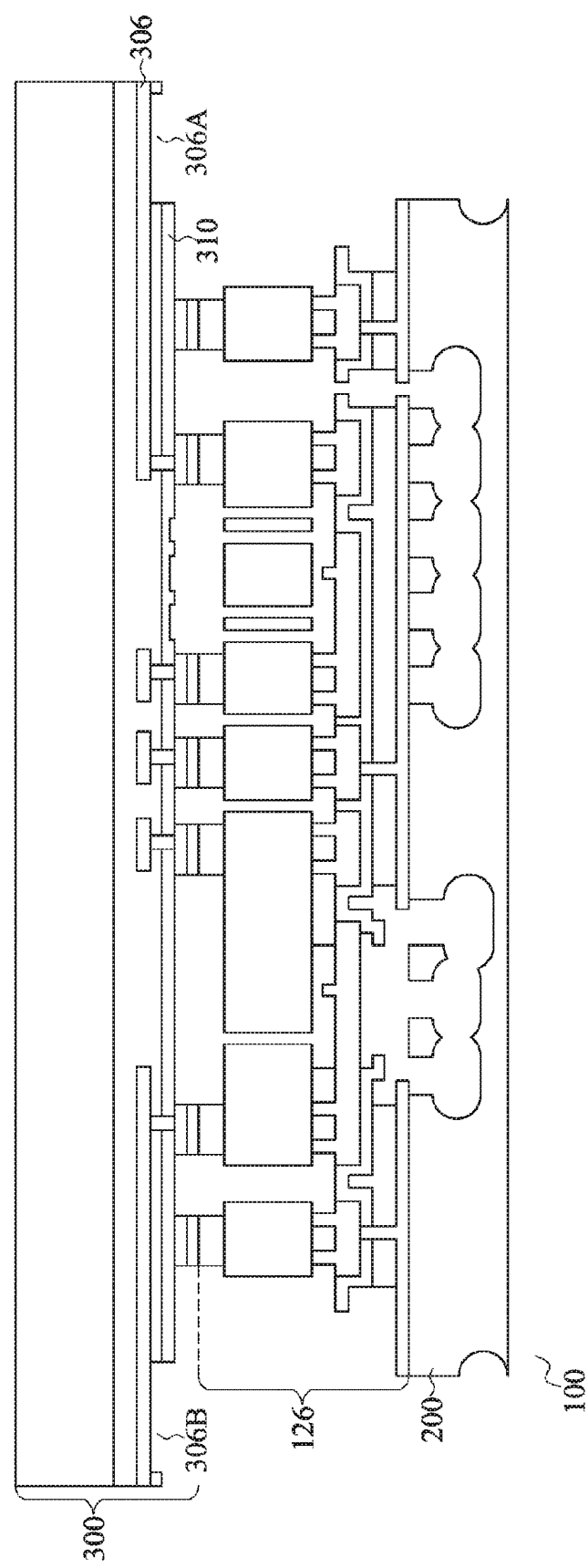
Figure 1A:
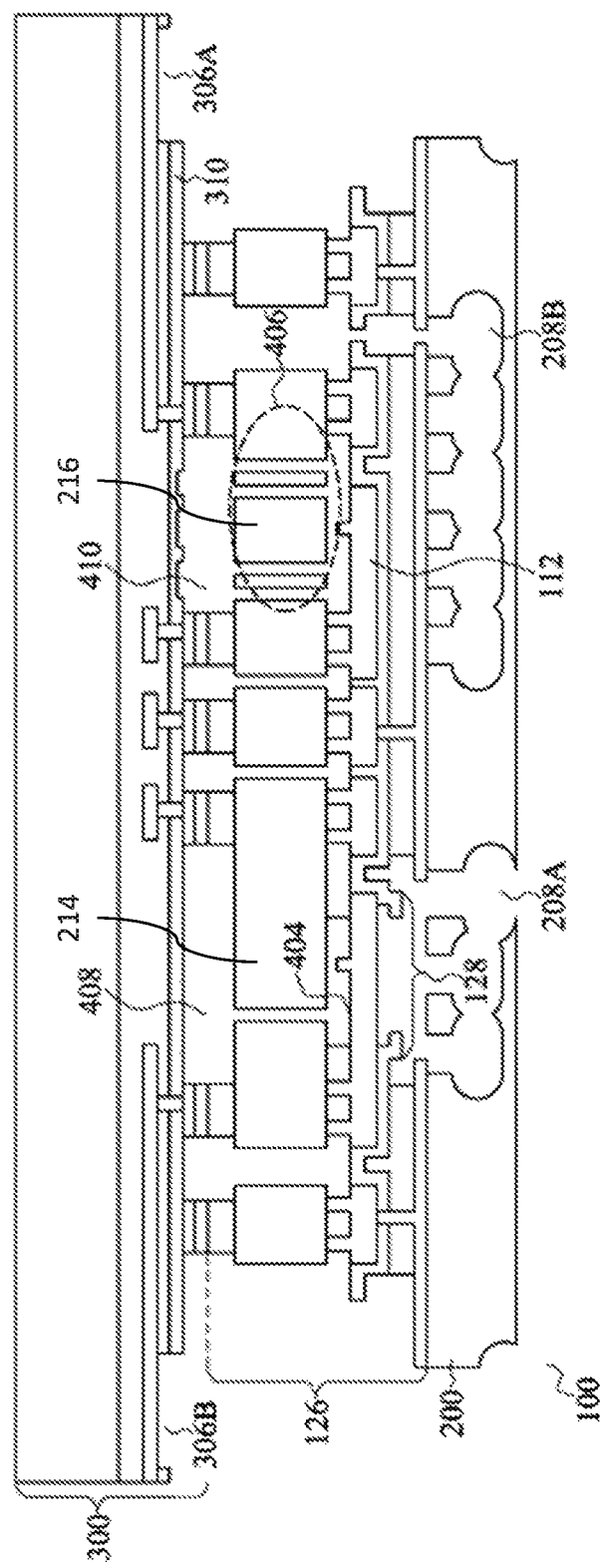
Figure 2:
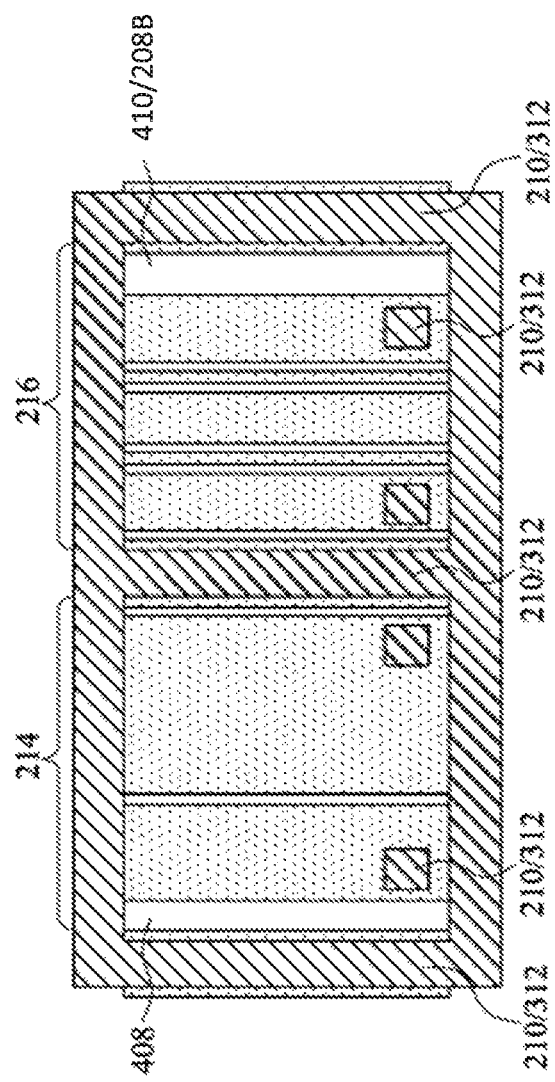
FIG. 2 is a top-down view of a portion of a MEMS device in accordance with various embodiments.

FIG. 1Z illustrates the stacked MEMS device 100, wherein cap wafer 300 is stacked over MEMS wafer 126 and carrier wafer 200. Cap wafer 300 may be bonded to MEMS wafer 126 by eutectic bonding between the bonds 210 and bonds 312. As shown in FIG. 1Z, through the eutectic bonding process, moveable elements (e.g., MEMS structure 214 and 216) may be located between a polysilicon layer 112 and cap wafer 300. Furthermore, cap wafer 300 and MEMS wafer 126 are aligned so that bumps 314 are aligned with MEMS structure 216. MEMS structures 214 and 216 are disposed in sealed cavities defined by the eutectic bonding. That is, in a top-down view of portions of MEMS device 100 (see FIG. 2), at least a portion of the eutectic bonds formed between bonds 210 and 312 form closed loops, sealing MEMS structures 214 and 216 in enclosed cavities 408 and 410, respectively. Notably, cavity 410 may be connected to cavity 208B of carrier wafer 200 (see FIG. 1AC) to form a sealed cavity comprising both cavities 410 and 208B.

In FIG. 1AA, a grinding process is performed to remove portions of MEMS wafer 126 and carrier wafer 200. The grinding may also be referred to as an open pad grinding (OPG) exposing portions of cap wafer 300 and may be done using known grinding techniques. The OPG may be facilitated by the inclusion of cavities 208 in carrier wafer 200 (see FIG. 1Z). That is, portions of MEMS wafer 126 and carrier wafer 200 may be easily removed by removing a small portion of carrier wafer 200 (defined by the placement of cavities 208). In FIG. 1AB, portions of film layer 310 and conforming oxide layer 308 may also be removed (e.g., using dry etch) to expose portions of metal lines 306. These exposed portions of metal line 306 (i.e., portions 306A and 306B) may be used as input/output pads to electrically couple circuits in cap wafer 300 to external circuits (not shown).

In FIG. 1AC, portions of carrier wafer 200 may be removed to expose cavity 208A to ambient pressure. That is, cavity 208A is exposed to an open air environment. The removal of portions of carrier wafer 200 may include known etching techniques such as CMP, etch-back, or the like. Notably, the removal of portions of carrier wafer 200 may not expose cavity 208B to ambient pressure. That is cavity 208B may remain sealed because cavity 208A includes a portion that extends deeper into substrate 202 than cavity 208B.

FIG. 1AC illustrates a completed MEMS device 100 in accordance with various embodiments. MEMS device 100 includes a pressure sensor 404 and a device 406. Pressure sensor 404 includes a membrane (i.e., region 128 of polysilicon layer 112). The membrane is exposed to ambient pressure on one surface (e.g., through cavity 208A) and sealed pressure on the other surface (e.g., through sealed cavity 408). The pressure of sealed cavity 408 may be defined by the conditions of the eutectic bonding process between MEMS wafer 126 and cap wafer 300. For example, the eutectic bonding process may be performed in a chamber having a certain pressure level to define an appropriate pressure level for sealed cavity 408 and 410 (explained in greater detail below). Therefore, pressure sensor 404 may detect ambient pressure by comparing the difference between cavity 208A and sealed cavity 408.

Device 406 may be a motion sensor that allows for the detection of motion through the disposition of a proof mass (i.e., MEMS structure 216) over an electrode (i.e., portions of polysilicon layer 112) in a sealed cavity 410 having pressure defined by eutectic bonding. Alternatively, device 406 may be an accelerometer, a gyroscope, or the like. The pressure of sealed cavity 410 may be selected in accordance with the desired functionality of device 406. For example, sealed cavity 410 may have a pressure between about 100-700 mbar for an accelerometer, between about $10^{-4}$ mbar to about 10 mbar for a gyroscope, or the like. Furthermore, cavity 208B may be included in MEMS device 100 for pressure reduction. That is, the pressure of cavity 410 may be controlled by increasing the volume of cavity 208B connected to cavity 410 using known physical relationships (i.e., the ideal gas law dictates that PV=nRT and as volume increases, pressure decreases). Thus, using the various formation steps illustrated in FIGS. 1A-1AC, a pressure sensor and another MEMS device may be formed using the same MEMS manufacturing process.

Although the present embodiments and their advantages have been described in detail, it should be understood that various changes, substitutions and alterations can be made herein without departing from the spirit and scope of the disclosure as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
providing a first micro-electromechanical (MEMS) device, the first MEMS device comprising a membrane and a first sealed cavity, the membrane having a first surface, wherein a boundary of the first sealed cavity comprises the first surface; and
exposing a second surface of the membrane to an ambient pressure level, wherein exposing the second surface comprises:
patterning one or more openings in a first substrate using a first etching process;
connecting bottom portions of the one or more openings using a second etching process to form a second cavity;
aligning the second cavity with the second surface of the membrane; and
exposing the second cavity to the ambient pressure level.

2. The method of claim 1, wherein providing the first MEMS device comprises bonding a second substrate to a plurality of conductive bonds formed over the membrane, and wherein a pressure level of the first sealed cavity is defined by a eutectic bonding process used to bond the second substrate to the plurality of conductive bonds.

3. The method of claim 1 further comprising forming a first MEMS structure aligned with the membrane for the first MEMS device, wherein forming the first MEMS structure comprises:
providing a wafer comprising the membrane, a substrate, and an oxide release layer;
patterning the substrate to define a shape of the first MEMS structure; and
removing portions of the oxide release layer.

4. The method of claim 3 further comprising:
forming a second MEMS structure adjacent the first MEMS structure; and
disposing the second MEMS structure in a third sealed cavity, wherein disposing the second MEMS structure in the third sealed cavity comprises bonding a second substrate to a plurality of conductive bonds formed over the membrane, and wherein a pressure level of the third sealed cavity is defined by a eutectic bonding process used to bond the second substrate to the plurality of conductive bonds.

5. The method of claim 4 further comprising:
patterning one or more additional openings in the first substrate using the first etching process;
connecting bottom portions of the one or more openings using the second etching process to form a portion of the third sealed cavity; and
aligning the third sealed cavity with the second MEMS structure, wherein the pressure level of the third sealed cavity is further defined by a volume of the portion of the third sealed cavity in the first substrate.

6. The method of claim 1, wherein the second etching process is an isotropic etching process.

7. The method of claim 1 further comprising:
forming a protection layer on sidewalls of the one or more openings; and
after connecting the bottom portions of the one or more openings, removing the protection layer.

8. The method of claim 1, wherein patterning the one or more openings comprises patterning one or more openings having varying depths by controlling a respective width of each of the one or more openings.

9. A device comprising:
a membrane of a first micro-electromechanical (MEMS) device;
a first sealed cavity over and aligned with the membrane, wherein a first surface of the membrane is exposed to a first pressure level of the first sealed cavity;
a first substrate comprising a second cavity under and aligned with the membrane, wherein the second cavity comprises:
a first portion extending partially into the first substrate, wherein a material of the first substrate is disposed under the first portion of the second cavity; and
a second portion connected to the first portion, wherein the second portion extends lower than the first portion to extend through the first substrate and expose a second surface of the membrane to an ambient pressure level;
a first MEMS structure disposed in the first sealed cavity; and
a second MEMS structure adjacent the first MEMS structure and disposed in a third sealed cavity, at least a portion of the third sealed cavity is disposed in the first substrate, and wherein the third sealed cavity comprises an upper portion and a lower portion wider than the upper portion.

10. The device of claim 9, wherein at least a portion of the first sealed cavity is disposed between the first MEMS structure and a second substrate, and wherein the second substrate is bonded to a plurality of conductive bonds disposed over the membrane.

11. A device comprising:
a micro-electromechanical (MEMS) portion comprising:
a membrane of a first MEMS device; and
a first MEMS structure higher than the membrane, wherein the first MEMS structure is part of a second MEMS device;
a first substrate bonded to the MEMS portion, wherein a first surface of the membrane is exposed to ambient pressure by a first cavity extending through the first substrate; and
a second substrate bonded to the MEMS portion, wherein the second substrate and the MEMS portion define a second cavity and a third cavity, and wherein:
a second surface of the membrane is exposed to a sealed pressure level of the second cavity; and
the first MEMS structure is disposed in the third cavity.

12. The device of claim 11, wherein the first MEMS device is a pressure sensor device, and wherein the second MEMS device provides a different function than the first MEMS device.

13. The device of claim 12, wherein the second MEMS device is a motion sensor, a gyroscope, or an accelerometer.

14. The device of claim 11, wherein the MEMS portion further comprises a second MEMS structure adjacent the first MEMS structure and aligned with the membrane, and wherein the second MEMS structure is disposed in the first cavity.

15. The device of claim 11, wherein the first cavity comprises:
an upper portion comprising a first opening, the upper portion having a first width; and a lower portion connected to the upper portion, the lower portion having a second width, wherein the first width is less than the second width.

16. The device of claim 11, wherein the first cavity comprises:
   a first portion, wherein a material of the first substrate extends under the first portion; and
   a second portion adjacent the first portion, wherein the second portion extends through the first substrate.

17. The device of claim 11, wherein the third cavity extends at least partially into the first substrate.

18. The device of claim 9, wherein the first MEMS device is a pressure sensor device.

19. The device of claim 9, wherein the second MEMS structure and the third sealed cavity are parts of a second MEMS device.

20. The device of claim 19, wherein the second MEMS device is a motion sensor, a gyroscope, or an accelerometer.

* * * * *